United States Patent
Nguyen

(10) Patent No.: US 6,172,406 B1
(45) Date of Patent: Jan. 9, 2001

(54) BREAKDOWN DRAIN EXTENDED NMOS

(75) Inventor: Baoson Nguyen, Plano, TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/140,254

(22) Filed: Aug. 26, 1998

Related U.S. Application Data

(60) Provisional application No. 60/056,987, filed on Aug. 26, 1997.

(51) Int. Cl.[7] .................................................. H01L 31/119
(52) U.S. Cl. ......................... 257/408; 257/268; 257/262; 257/339; 257/344
(58) Field of Search .................................... 257/339–344, 257/262–268, 408, 336

*Primary Examiner*—Fetsum Abraham
(74) *Attorney, Agent, or Firm*—Wade James Brady, III; Frederick J. Telecky, Jr.

(57) ABSTRACT

An MOS device and the method of making the device which includes a semiconductor substrate having a well therein of predetermined conductivity type. A tank having a surface is disposed within the well. The tank has a highly doped region of opposite conductivity type and a lightly doped region of opposite conductivity type between the highly doped region and the surface of tank. The lightly doped region in the tank is doped both the predetermined conductivity type and the opposite conductivity type with a resulting net lightly opposite conductivity type doping. A drain region of opposite conductivity type is disposed in the region of the tank between the highly doped region and the surface and disposed at the surface and a source region of opposite conductivity type is disposed in the well and spaced from the tank. The channel region includes the surface region of the tank between the drain region and the well and the surface region of the well between the source region and the tank, the junction region between the tank and the well having a graded doping level. The predetermined conductivity type is preferably p-type to provide an NMOS transistor.

16 Claims, 1 Drawing Sheet

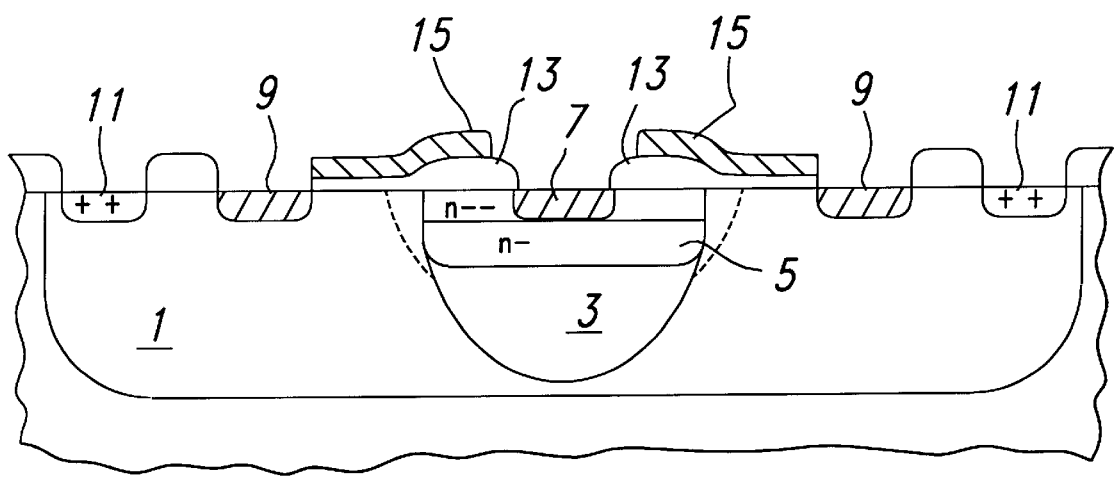

BREAKDOWN DRAIN EXTENDED NMOS

This application claims priority under 35 USC § 119(e)(1) of provisional application Ser. No. 60/056,987 filed Aug. 26, 1997.

BACKGROUND OF THE INVENTION

1. Field of the Invention

This invention relates to a drain extended NMOS semiconductor device which has increased breakdown voltage and requires fewer processing steps for fabrication than do prior art NMOS devices with equivalent breakdown voltages.

2. Brief Description of the Prior Art

In the fabrication of NMOS devices, especially for automotive applications, breakdown voltages of such devices required to be at least 40 volts. The prior art standard process for fabrication of NMOS devices yields breakdown voltages of about 33 volts. Additional processing steps must be added to the standard NMOS fabrication process in order to obtain a breakdown voltage of at least 40 volts.

A standard prior art process for fabrication of NMOS transistors generally involved providing a semiconductor material having an lightly doped p-type well therein. The material was then masked to provide an opening in the central region through which there was provided a tank having a shallow light n-type implant. The device was then masked and a heavy doping n-type was implanted at the surface into the central portion of the previously masked region to form a drain region and in the p-type well spaced from the previously masked region to provide a source region. A further masking and heavy doping p-type then takes place in the p-type well remote from the drain to form a backgate. At some time during the process, a heavy doping p-type is provided in the tank between the source and drain regions to provide a channel stop in standard manner. A gate oxide is then formed over the device surface between the source and drain regions and a polysilicon gate electrode is then formed over the gate oxide, both in standard manner.

SUMMARY OF THE INVENTION

In accordance with the present invention, the above described prior art NMOS device is altered by removing the channel stop and by providing a deep tank having a highly doped n-type region over which is a resulting lightly region doped with both n-type and p-type with an excess of n-type. The NMOS device in accordance with the present invention has been initially tested and found to have a breakdown voltage of 131 volts, this being far in excess of the breakdown voltage presently required in the automotive industry.

Briefly, there is provided a semiconductor device having a lightly doped p-type well with a central region of the well having a tank which was formed by masking the well and implanting a deep n-type implant and a more shallow implant of both n-type and p-type which has a slight excess of n-type dopant to provide a centrally located tank having a lightly doped n-type region over a lightly doped n-type region with the surface being very lightly doped n-type and being a graded structure in the direction of the device surface and p-type region of the well. A highly doped n-type drain region is disposed within the lightly doped n-type region and a heavily doped n-type source region is disposed within the p-type well spaced from the central region. A highly doped p-type backgate is disposed in the lightly doped p-type well spaced from the source region remote from the central region. A gate oxide is disposed on the surface of the device between the source and drain regions with a polysilicon gate electrode disposed thereover.

As noted above, no channel stop is used, there being merely the lightly doped P-type region of the tank and the lightly doped n-type central region in the channel to provide essentially a graded junction and, thereby, a low intensity field at the junction. The breakdown voltage of the above described NMOS transistor was measured at 131 volts which is far in excess of the breakdown voltages achievable in the prior art.

The above described NMOS transistor is fabricated by providing a semiconductor material having an lightly doped p-type well therein. The material is then masked to provide an opening in the central region through which there is provided a tank having a light doping n-type implant at about $4 \times 10^{+12}$ at 80 Kev which will be driven to the desired depth by temperature and a shallow light doping n-type at about $8 \times 10^{+12}$ at 80 KeV and a light doping p-type at about $2.5 \times 10^{+12}$ at 40 KeV, there being a slight excess of n-type. With the subsequent diffusion of the implanted dopant, the surface of the device within the masked region will be very lightly doped n-type. The device is then masked and a heavy dopant n-type is implanted at the surface into the central portion of the previously masked region to form a drain region and in the p-type well spaced from the previously masked region to provide a source region. A further masking and heavy implant p-type then takes place in the p-type well remote from the drain to form a backgate. A gate oxide is then formed over the device surface between the source and drain regions and a polysilicon gate electrode is then formed over the gate oxide, both in standard manner.

BRIEF DESCRIPTION OF THE DRAWINGS

The FIGURE is a cross sectional view of an NMOS transistor in accordance with the present invention.

DESCRIPTION OF THE PREFERRED EMBODIMENT

With reference to the FIGURE, there is provided a semiconductor device having a lightly doped p-type well 1 with a central region of the well which has been masked and wherein there has been implanted a tank having a deep n-type implant 3 and a more shallow implant 5 of both n-type and p-type which has a slight excess of n-type dopant to provide a centrally located lightly doped n-type region over a highly doped n-type region with the surface being very lightly doped n-type in place of the prior art channel stop. A highly doped n-type drain region 7 is disposed within the lightly doped n-type region 5 and a heavily n-type doped source region 9 is disposed within the p-type well 1 spaced from the central region. A highly doped p-type backgate 11 is disposed in the lightly doped p-type well 1 spaced from the source region 9 and remote from the central region. A gate oxide 13 is disposed on the surface of the device between the source 9 and drain 7 regions with a polysilicon gate electrode 15 disposed thereover, No channel stop is used, there being merely the lightly doped P-type region of the well and the lightly doped n-type central region in the tank which forms the channel. The breakdown voltage of the above described NMOS transistor was measured at 131 volts which is far in excess of the breakdown voltages achievable in the prior art. The lightly doped P-type region of the tank and the lightly doped n-type central region in the channel provide essentially a graded junction and, thereby, a low intensity field at the junction.

The above described NMOS transistor is fabricated by providing a semiconductor material having an lightly doped p-type well 1 therein. The material is then masked to provide an opening in the central region through which there is provided a deep heavy implant of n-type 3 at about $4 \times 10^{+12}$ at 80 KeV and a shallow light implant of n-type at about $8 \times 10^{+12}$ and a light implant of p-type 5 at about $2.5 \times 10^{+12}$ with a slight excess of n-type. With the subsequent diffusion of the implanted dopant, the surface of the device within the masked region will be very lightly doped n-type. The device is then masked and a heavy dopant of n-type is implanted at the surface into the central portion of the previously masked region to form a drain region 7 and in the p-type well spaced from the previously masked region to provide a source region 9. A further masking and heavy implant of p-type then takes place in the p-type well remote from the drain to form a backgate 11. A gate oxide 13 is then formed over the device surface between the source and drain regions and a polysilicon gate electrode 15 is then formed over the gate oxide, both in standard manner.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. An MOS device which comprises:
   (a) a semiconductor substrate having a well therein of predetermined conductivity type;
   (b) a tank having a surface and disposed within said well, said tank having a highly doped region of opposite conductivity type and a lightly doped region of said opposite conductivity type between said highly doped region and the surface of said tank;
   (c) a drain region disposed in said region of said tank between said highly doped region and said surface and disposed at said surface; and
   (d) a source region disposed in said well and spaced from said tank.

2. The device of claim 1 wherein said lightly doped region in said tank is doped both said predetermined conductivity type and said opposite conductivity type with a resulting net lightly opposite conductivity type doping.

3. The device of claim 2 wherein said drain and source regions are highly doped regions of said opposite conductivity type.

4. The device of claim 3 further including a channel region including the surface region of said tank between said drain region and said well and the surface region of said well between said source region and said tank, the junction region between said tank and said well having a graded doping level.

5. The device of claim 3 wherein said predetermined conductivity type is p-type.

6. The device of claim 4 wherein said predetermined conductivity type is p-type.

7. The device of claim 2 further including a channel region including the surface region of said tank between said drain region and said well and the surface region of said well between said source region and said tank, the junction region between said tank and said well having a graded doping level.

8. The device of claim 7 wherein said predetermined conductivity type is p-type.

9. The device of claim 2 wherein said predetermined conductivity type is p-type.

10. The device of claim 1 wherein said drain and source regions are highly doped regions of said opposite conductivity type.

11. The device of claim 10 further including a channel region including the surface region of said tank between said drain region and said well and the surface region of said well between said source region and said tank, the junction region between said tank and said well having a graded doping level.

12. The device of claim 11 wherein said predetermined conductivity type is p-type.

13. The device of claim 10 wherein said predetermined conductivity type is p-type.

14. The device of claim 1 further including a channel region including the surface region of said tank between said drain region and said well and the surface region of said well between said source region and said tank, the junction region between said tank and said well having a graded doping level.

15. The device of claim 14 wherein said predetermined conductivity type is p-type.

16. The device of claim 1 wherein said predetermined conductivity type is p-type.

* * * * *